US007500780B2

(12) United States Patent
Miki et al.

(10) Patent No.: US 7,500,780 B2
(45) Date of Patent: Mar. 10, 2009

(54) FLEXIBLE WIRED CIRCUIT BOARD FOR TEMPERATURE MEASUREMENT

(75) Inventors: Yosuke Miki, Osaka (JP); Yasuhito Ohwaki, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/694,772

(22) Filed: Oct. 29, 2003

(65) Prior Publication Data

US 2004/0086026 A1    May 6, 2004

(30) Foreign Application Priority Data

Nov. 5, 2002    (JP) .............................. 2002-321116

(51) Int. Cl.
*G01K 7/16*    (2006.01)
(52) U.S. Cl. ...................... 374/144; 374/185; 374/163; 374/45; 374/208
(58) Field of Classification Search ................... 374/57, 374/185, 183, 208, 163, 142, 179, 144, 45; 338/22 R, 210–211, 283
See application file for complete search history.

(56) References Cited

U.S. PATENT DOCUMENTS

| 2,758,256 A | * | 8/1956 | Eisler ......................... 361/777 |
| 3,966,578 A | * | 6/1976 | Sommer ................. 204/192.14 |
| 4,103,275 A | * | 7/1978 | Diehl et al. ................... 338/25 |
| 4,149,066 A | * | 4/1979 | Niibe ......................... 219/505 |
| 4,306,217 A | | 12/1981 | Solow |
| 4,464,646 A | * | 8/1984 | Burger et al. ................. 338/25 |
| 4,545,690 A | * | 10/1985 | Zysman et al. ............... 374/165 |
| 4,659,912 A | * | 4/1987 | Derbyshire ................. 219/535 |
| 4,882,466 A | * | 11/1989 | Friel .......................... 219/219 |
| 4,937,435 A | * | 6/1990 | Goss et al. ................... 219/528 |
| 4,953,986 A | * | 9/1990 | Olson et al. ................. 374/136 |
| 4,955,380 A | * | 9/1990 | Edell .......................... 600/355 |
| 5,037,488 A | * | 8/1991 | Wienand .................... 136/230 |
| 5,044,767 A | * | 9/1991 | Gustafsson .................. 374/44 |
| 5,047,827 A | * | 9/1991 | Clark et al. ................. 257/537 |

(Continued)

FOREIGN PATENT DOCUMENTS

DE        195 12 813        6/1996

(Continued)

*Primary Examiner*—Gail Verbitsky
(74) *Attorney, Agent, or Firm*—Jean C. Edwards, Esq.; Akerman Senterfitt

(57) ABSTRACT

A flexible wired circuit board for temperature measurement that can provide an accurate temperature measurement even when placed in a high-temperature atmosphere and can also be provided at a reduced cost. In the flexible wired circuit board for temperature measurement, a conductor layer formed from a metal foil, such as a stainless foil, having a proportional relation between temperature and specific electric resistance is formed on a base insulating layer. Also, a single thin sensor wiring in a sensor portion exposed from a cover insulating layer is formed into a certain pattern by folding back the sensor wiring in a continuous S-shaped form, such that adjacent parts of the wiring extending in parallel are spaced apart from each other at a predetermined interval in a widthwise direction of the conductor layer. The flexible wired circuit board for temperature measurement thus constructed can prevent occurrence of errors in measured temperature even when used in high-temperature atmosphere, thus achieving accurate measurement of temperature, different from the flexible wired circuit board having the conductor layer comprising a copper foil.

5 Claims, 6 Drawing Sheets

U.S. PATENT DOCUMENTS

| | | | | |
|---|---|---|---|---|
| 5,053,740 A | * | 10/1991 | Schultz et al. | 338/25 |
| 5,134,248 A | * | 7/1992 | Kiec et al. | 174/84 R |
| 5,178,468 A | * | 1/1993 | Shiokawa et al. | 374/185 |
| 5,181,007 A | * | 1/1993 | Friese et al. | 338/22 R |
| 5,332,991 A | * | 7/1994 | Kojima et al. | 338/25 |
| 5,385,785 A | * | 1/1995 | Lovell | 428/408 |
| 5,430,428 A | | 7/1995 | Gerblinger et al. | |
| 5,482,793 A | * | 1/1996 | Burns et al. | 429/62 |
| 5,519,191 A | * | 5/1996 | Ketcham et al. | 219/552 |
| 5,558,099 A | * | 9/1996 | Bowman et al. | 600/538 |
| 5,573,004 A | * | 11/1996 | Groenke | 600/537 |
| 5,707,148 A | * | 1/1998 | Visser et al. | 374/31 |
| 5,790,026 A | * | 8/1998 | Lardiere et al. | 340/581 |
| 5,823,680 A | * | 10/1998 | Kato et al. | 374/185 |
| 5,831,512 A | * | 11/1998 | Wienand et al. | 338/25 |
| 6,077,228 A | * | 6/2000 | Schonberger | 600/549 |
| 6,123,675 A | * | 9/2000 | Kreizman et al. | 600/549 |
| 6,152,597 A | * | 11/2000 | Potega | 374/185 |
| 6,209,402 B1 | * | 4/2001 | Yamada | 73/861.26 |
| 6,341,892 B1 | * | 1/2002 | Schmermund | 374/185 |
| 6,354,736 B1 | * | 3/2002 | Cole et al. | 374/185 |
| 6,431,750 B1 | * | 8/2002 | Haberbusch et al. | 374/166 |
| 6,432,287 B1 | * | 8/2002 | McMackin et al. | 204/424 |
| 6,588,931 B2 | * | 7/2003 | Betzner et al. | 374/185 |
| 6,762,671 B2 | * | 7/2004 | Nelson | 338/25 |
| 6,762,672 B2 | * | 7/2004 | Taguchi et al. | 338/25 |
| 6,784,012 B2 | * | 8/2004 | Pekola et al. | 438/54 |
| 6,861,939 B1 | * | 3/2005 | Bischof et al. | 338/23 |
| 2002/0071475 A1 | * | 6/2002 | Betzner et al. | 374/185 |
| 2002/0075128 A1 | * | 6/2002 | Wienand et al. | 338/25 |
| 2002/0135454 A1 | * | 9/2002 | Ichida et al. | 338/25 |
| 2002/0172255 A1 | * | 11/2002 | Pannek et al. | 374/121 |
| 2003/0016116 A1 | * | 1/2003 | Blaha | 338/2 |
| 2003/0152130 A1 | * | 8/2003 | Heine et al. | 374/100 |
| 2004/0118595 A1 | * | 6/2004 | Flammer et al. | 174/254 |
| 2005/0141591 A1 | * | 6/2005 | Sakano | 374/163 |
| 2006/0034346 A1 | * | 2/2006 | Salo et al. | 374/185 |
| 2006/0208848 A1 | * | 9/2006 | Kawamoto et al. | 338/22 R |

FOREIGN PATENT DOCUMENTS

| | | | | |
|---|---|---|---|---|
| JP | S60-170201 | | | 9/1985 |
| JP | 61179764 | A | * | 8/1986 |
| JP | 62-259025 | | | 11/1987 |
| JP | H05-055016 | | | 3/1993 |
| JP | 05180702 | A | * | 7/1993 |
| JP | 6-507521 | | | 8/1994 |
| JP | H07-005050 | | | 1/1995 |
| JP | 07296786 | A | * | 11/1995 |
| JP | 2001-188547 | | | 7/2001 |

* cited by examiner (a)

(b)

(c)

(d)

FLEXIBLE WIRED CIRCUIT BOARD FOR TEMPERATURE MEASUREMENT

This application claims priority from Japanese Patent Application No. 2002-321116, filed Nov. 5, 2002, the entire contents of which are herein incorporated by reference to the extent allowed by law.

BACKGROUND OF THE INVENTION

1. Field of the Invention

The present invention relates to a flexible wired circuit board for temperature measurement and, more particularly, to a flexible wired circuit board for temperature measurement used as a temperature sensor.

2. Description of the Prior Art

In general, a thermocouple used for an automotive engine control is disposed in the vicinity of fuel combustion chamber of an automotive engine, for calculating combustion time, angles of valve heads, a mixing ratio between air and fuel (an air-fuel ratio), etc.

The thermocouple is usually disposed at a front end of a wired circuit board and covered with a cover member formed of heat-resistant material to protect the thermocouple from high-temperature atmosphere around the engine, so as to prevent errors caused by thermal electromotive force generated from parts other than points of contact for measuring temperature.

A variety of control methods have been proposed for providing improved temperature measurement accuracy of the thermocouple (e.g. Japanese Laid-open (Unexamined) Patent Publication No. 2001-188547).

To take a more accurate measurement of the temperature of the fuel combustion chamber of the engine by using the thermocouple, it is necessary that the thermocouple is positioned to be as close to the fuel combustion chamber as possible. However, since a conductive pattern of the wired circuit board is formed from copper foil, the conductive pattern, when used in a high-temperature atmosphere, changes in crystal structure, resulting in failure of a proportional relation of specific electric resistance of the conductive pattern to temperature. The changes in electric resistance cause errors in measured temperature. Due to this, the thermocouple is obliged to be spaced apart at a certain distance from the fuel combustion chamber of the engine, so that it is unavoidable that the temperature measurement accuracy of the thermocouple is reduced to that extent.

On the other hand, the temperature measurement accuracy of the thermocouple may be improved by use of a control, as mentioned above, but there is a limit to the improvement of the temperature measurement accuracy of the thermocouple by use of the control.

Further, covering the thermocouple with the cover member as mentioned above causes increase in manufacturing cost by the provision of the cover member.

SUMMARY OF THE INVENTION

It is the object of the invention to provide a flexible wired circuit board for temperature measurement that can provide an accurate measurement of temperature even when placed in a high-temperature atmosphere and can also be provided at a reduced cost.

The present invention provides a flexible wired circuit board for temperature measurement comprising a conductor layer having a temperature detecting portion, wherein the conductor layer is formed from a metal foil having a proportional relation between temperature and specific electric resistance.

This flexible wired circuit board for temperature measurement, which comprises the conductor layer formed from a metal foil having a proportional relation between temperature and specific electric resistance, can prevent occurrence of errors in measured temperature even when used in a high-temperature atmosphere, differently from a conventional wired circuit board comprising the conductor layer formed from a copper foil, thus providing an accurate measurement of temperature. Also, since the conductor layer itself serves as the temperature detecting portion, there is no need to provide the cover member, thus achieving reduction of cost.

In the flexible wired circuit board for temperature measurement of the present invention, it is preferable that the conductor layer is a stainless foil.

Also, in the flexible wired circuit board for temperature measurement, it is preferable that the temperature detecting portion is formed in a pattern comprising a wiring folded in such a continuous form that adjacent parts of the wiring extending in parallel are spaced apart from each other at a predetermined interval. In this case, it is preferable that the wiring of the temperature detecting portion has an entire length of 50 mm or more. Also, it is preferable that the adjacent parts of the wiring in the temperature detecting portion are spaced apart from each other at a pitch of 100 μm or more.

The flexible wired circuit board for temperature measurement of the present invention can prevent occurrence of errors in measured temperature when used in a high-temperature atmosphere, thus achieving an accurate measurement of temperature, while providing reduction in cost.

Figure 1:
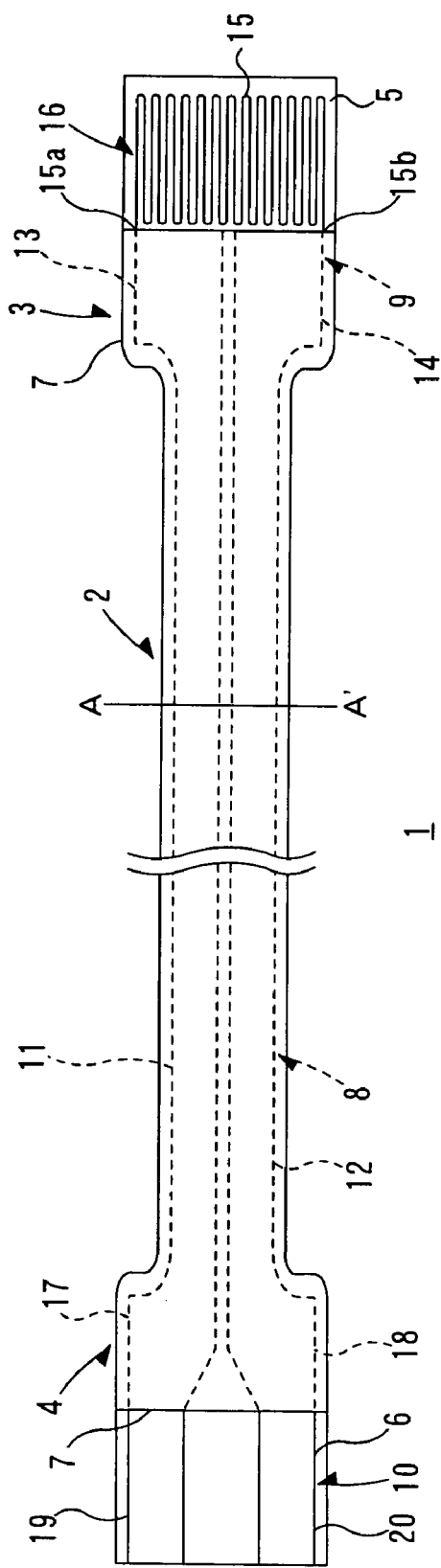
FIG. 1 is a plan view showing an embodiment of a flexible wired circuit board for temperature measurement of the present invention.
Figure 6:
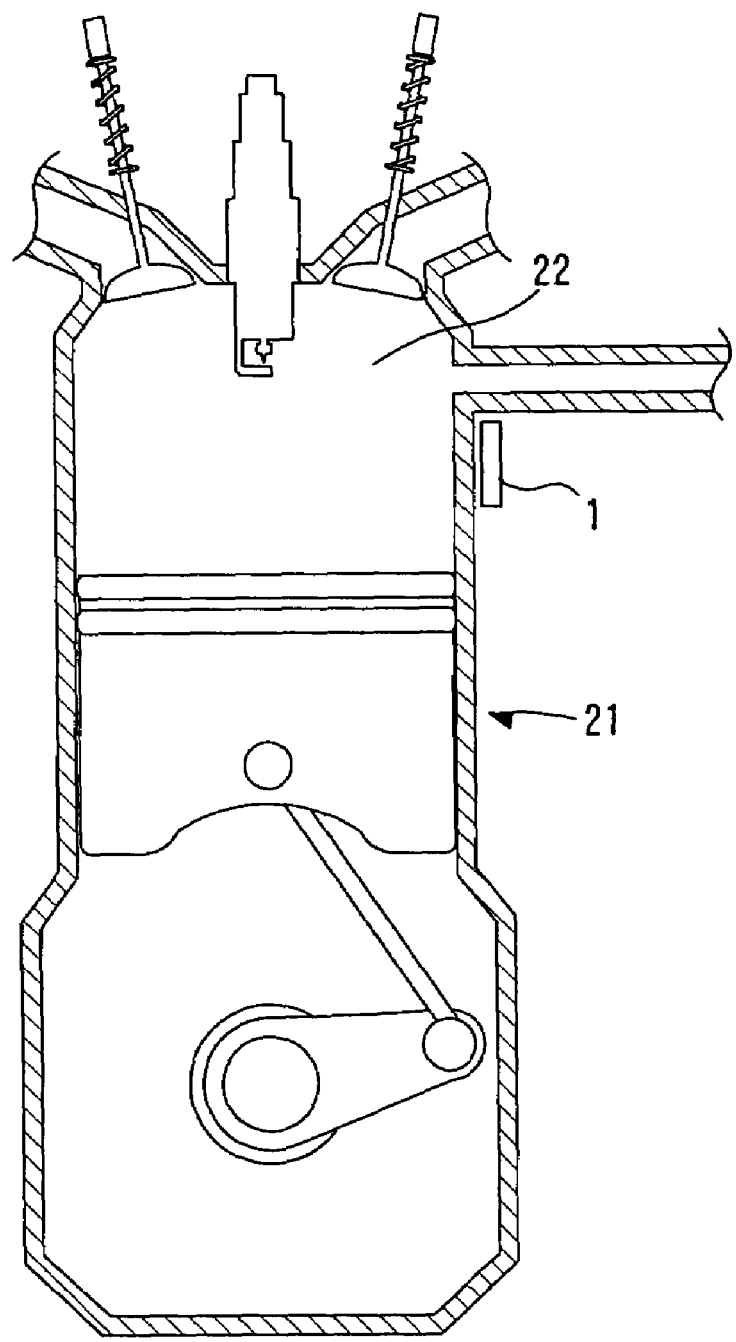

(a) shows the step of preparing a conductor layer;

(b) shows the step of forming a base insulating layer on the conductor layer;

(c) shows the step of patterning the conductor layer; and (d) shows the step of forming a cover insulating layer on the conductor layer; and FIG. 6 is a schematic illustration showing the state in which the flexible wired circuit board for temperature measurement shown in FIG. 1 is disposed in the vicinity of a fuel combustion chamber of an automotive engine.

DETAILED DESCRIPTION OF THE PREFERRED EMBODIMENTS

Figure 2:
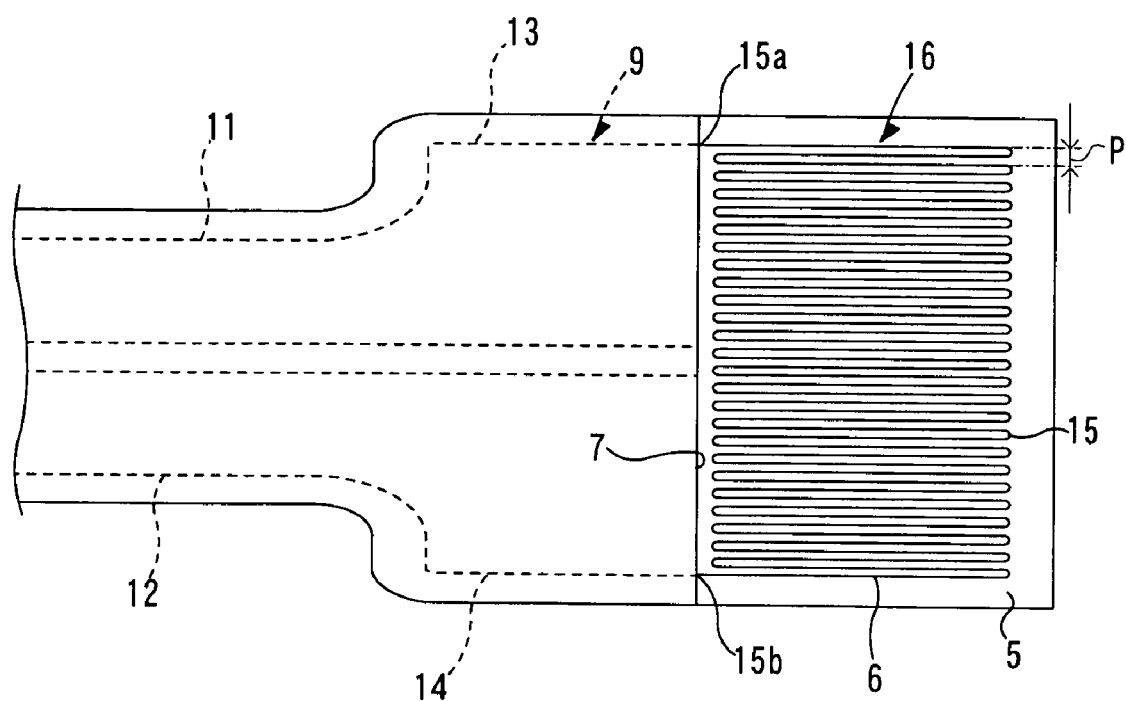
FIG. 2 is an enlarged plan view of a part of FIG. 1.
Figure 3:
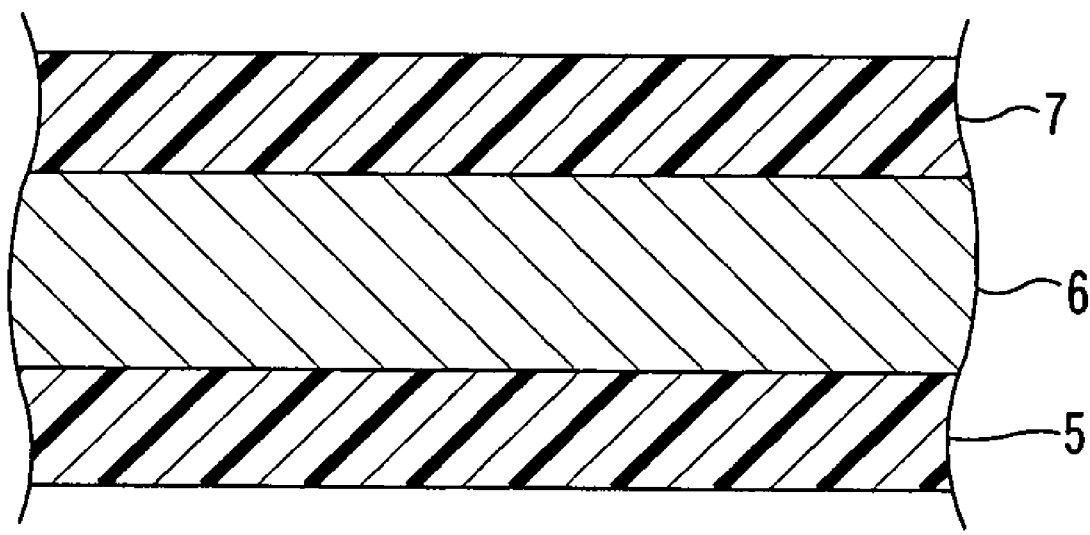
FIG. 3 is a sectional view of a part of the same taken along line A–A' of FIG. 1.

FIG. 1 is a plan view showing an embodiment of a flexible wired circuit board for temperature measurement of the present invention; FIG. 2 is an enlarged plan view of a part of FIG. 1; and FIG. 3 is a sectional view of a part of the same taken along line A–A' of FIG. 1. In the following, an embodiment of a flexible wired circuit board for temperature measurement of the present invention will be described with reference to FIGS. 1–3.

In FIG. 1, the flexible wired circuit board 1 for temperature measurement comprises a generally rectangular, flat, strip-shaped wiring-forming portion 2 extending longitudinally of the flexible wired circuit board 1, a generally rectangular, flat, widened sensor-forming portion 3 extending continuously from one lateral end of the wiring-forming portion 2, and a generally rectangular, flat, widened connector-forming portion 4 extending continuously from the other lateral end of the wiring-forming portion 2. The flexible wired circuit board 1 comprising these portions 2–4 is formed in one piece.

The flexible wired circuit board 1 for temperature measurement is formed to have an entire longitudinal length of e.g. 50 mm to 250 mm from the sensor-forming portion 3 to the connector-forming portion 4.

As shown in FIG. 3, the flexible wired circuit board 1 for temperature measurement further comprises a base insulating layer 5, a conductor layer 6 formed on the base insulating layer 5, and a cover insulating layer 7 formed on the conductor layer 6.

The base insulating layer 5 comprises a resin film of good flexibility. In consideration of heat resistance, dimensional stability, electric properties, mechanical properties and chemical resistance, it is formed from e.g. a polyimide film. The base insulating layer 5 usually has thickness of 2–35 μm, or preferably 5–15 μm.

Also, the base insulating layer 5 is formed into a basic form of the flexible wired circuit board 1 for temperature measurement, as shown in FIG. 1. Specifically, it is formed to have the wiring-forming portion 2 which is formed in a generally rectangular, flat, strip-shaped form extending longitudinally of the flexible wired circuit board 1, and the sensor-forming portion 3 and the connector-forming portion 4 which are formed in a generally rectangular, flat, widened form having a width larger than that of the wiring-forming portion 2.

The conductor layer 6 is formed from a metal foil having a proportional relation between temperature and specific electric resistance, such as stainless steel, titanium, gold, silver, platinum or alloys thereof It is preferably formed from a stainless foil, in consideration of manufacturing cost, material cost, and easiness in forming the flexible wired circuit board. A variety of stainless steels conforming the standards of AISI (American Iron and Steel Institute) can be used for the conductor layer 6, including SUS301, SUS304, SUS305, SUS309, SUS310, SUS316, SUS317, SUS321 and SUS347. Any of them can be used without any particular limitation, as long as it has a proportional relation between temperature and specific electric resistance.

It is to be noted here that the specific electric resistance, which is also called electrical resistivity, means the reciprocal of specific electric conductivity. In the case of a uniform conducting wire (wiring), an electric resistance $R(\Omega)$ is proportion to a length $L(m)$ of conducting wire and is inverse proportion to a cross-sectional area $S(m^2)$ in the following equation. In this equation, $\rho(\Omega \cdot m)$ is the specific electric resistance.

$$R=\rho(L/S)$$

Figure 4:
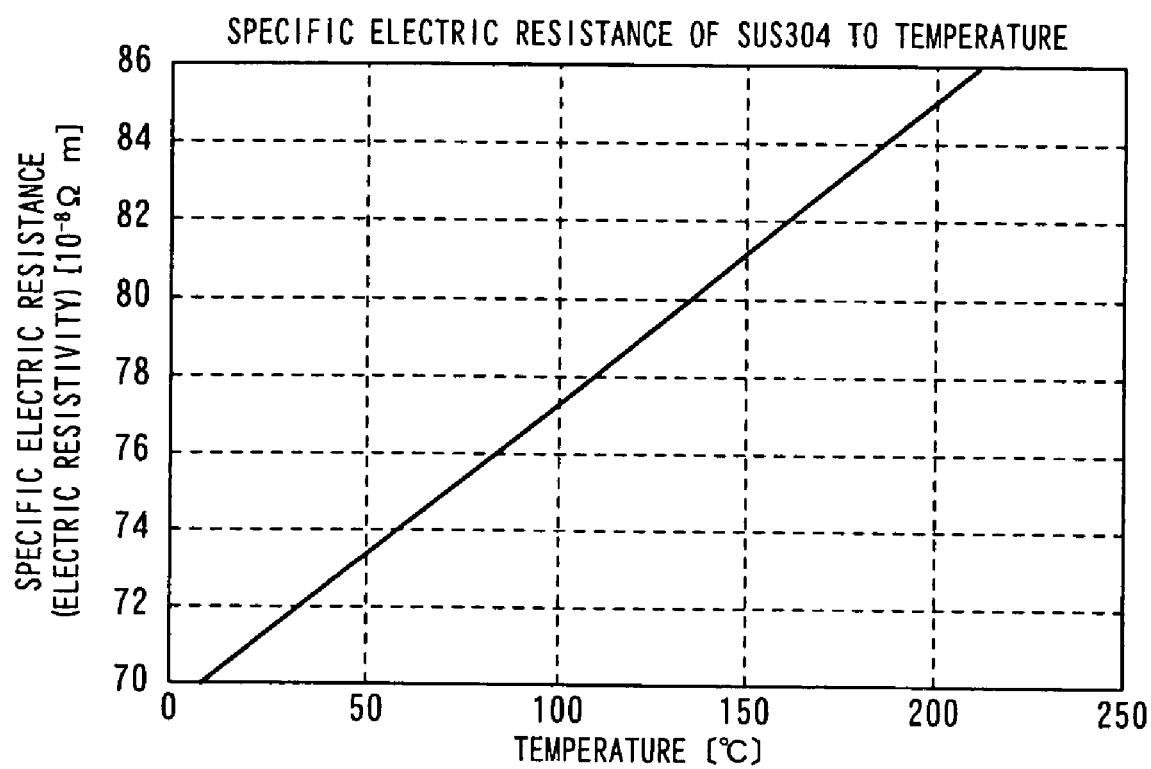
FIG. 4 is a view showing a correlation between specific electric resistance and temperature on stainless steel (SUS 304)

The metal foil having a proportional relation between temperature and specific electric resistance is intended to include any metal foils having such a relation that the specific electric resistance and temperature are in proportion to each other, like the stainless foil shown in FIG. 4, for example.

Usually, the thickness of the conductor layer 6 is set to be in the range of 10–50 μm, or preferably 18–35 μm.

The conductor layer 6 is created in the form of a predetermined pattern. More specifically, the conductor layer 6 comprises a main wiring portion 8, a sensor-wiring portion 9 extending continuously from one lateral end of the main wiring portion 8, and a connector-wiring portion 10 extending continuously from the other lateral end of the main wiring portion 8, as shown in FIG. 1. The conductor layer 6 comprising these portions 8–10 is formed in one piece to be in the form of a predetermined pattern.

The main wiring portion 8 comprises two main wirings 11, 12, each of which is formed to have a generally rectangular, elongate, plate-like form. The two main wirings 11 and 12 are formed on the base insulating layer 5 in the wiring-forming portion 2 in such a pattern that they extend all along the wiring forming portion 2 in the longitudinal direction and are spaced from each other at a little interval.

The two main wirings 11 and 12 are formed so thickly (wide-width) that they can keep sufficient current capacity. The main wirings 11, 12 have each a width (which is orthogonal to a longitudinal dimension of the flexible wired circuit board 1 for temperature measurement (the same definition applies to the widths occurring below)) which is set to be in the range of 0.5 mm–5.0 mm, or preferably 1.0 mm–3.0 mm, for example. The space width (distance) between the main wirings 11 and 12 is set to be in the range of 0.05 mm–3.0 mm, or preferably 0.1 mm–1.0 mm, for example.

The sensor-wiring portion 9 is in the form of a specific pattern on the base insulating layer 5 in the sensor-forming portion 3. The sensor-wiring portion 9 comprises two sensor wiring bases 13, 14 of a generally rectangular, flat, widened form, which extend continuously from the two main wirings 11, 12 respectively and are spaced from each other at a little interval, and a sensor portion 16 serving as a temperature detecting portion comprising a sensor wiring 15 which is formed in a thin, continuous S-shaped curve extending continuously from each of the sensor wiring bases 13 and 14, as shown in FIG. 2.

To be more specific, the sensor portion 16 is in the form of a pattern formed by a single thin sensor wiring 15 being folded back in a continuous S-shaped form, such that adjacent parts of the sensor wiring 15 extending in parallel are spaced apart from each other at a predetermined interval in a widthwise direction of the conductor layer 6. Both ends 15a, 15b of the sensor wiring 15 are connected to the sensor wiring bases 13, 14, respectively.

Forming the sensor portion 16 in this pattern can allow the sensor wiring 15 to string out in a limited space, and as such can allow the specific electric resistance to be measured with high accuracy.

To be more specific, the sensor wiring 15 in the sensor portion 16 has an entire length (a length extending between both ends 15a, 15b of the sensor wiring 15 folded back in the continuous S-shape) of 50 mm or more, or preferably 100 mm or more. If the sensor wiring 15 has a length shorter than 50 mm, then there is the possibility that the measurement of the specific electric resistance may reduce in accuracy. In consideration of the wiring space, it is usually preferable that the sensor wiring 15 has a length of 250 mm or less. By setting the length of the sensor wiring 15 to be in this dimensional range, the specific electric resistance can be measured with high accuracy.

In the sensor portion 16, the adjacent parts of the sensor wiring 15 are spaced apart at a pitch P (a width of the sensor wiring 15 plus a space width (interval) between the two adjacent parts of the sensor wiring 15) of 100 μm or more. If the pitch P is shorter than that, there is the possibility that a short circuit may be developed in the circuit. In consideration of the wiring space, it is usually preferable that the pitch P is set to be 300 µm or less. By setting the pitch P to be in that range, the specific electric resistance can be measured with high accuracy.

For example, in the sensor portion 16 having this pitch P, the width of the sensor wiring 15 is set to be in the range of 50–100 µm and the space width (interval) between two adjacent parts of the sensor wiring 15 are set to be in the range of 70–120 µm.

The connector-wiring portion 10 is in the form of a specific pattern on the base insulating layer 5 in the connector-forming portion 4. The connector-wiring portion 10 comprises two connector wiring bases 17, 18 of a generally rectangular, flat, widened form, which extend continuously from the two main wirings 11, 12 respectively and are spaced from each other at a little interval, and connector wirings 19, 20 of a generally rectangular, flat-plate form, which extend continuously from the two connector wiring bases 17, 18 respectively, as shown in FIG. 1. The connector wirings 19, 20 are used for connection with a specific electric resistance measuring device having the capability of temperature conversion (not shown).

When the conductor layer 6 is formed from stainless foil, for example, a passive film (oxide film) is preferably formed on a surface of the conductor layer 6 (at least in the sensor portion 16). Forming the passive film can provide a more linearly proportional correlation between temperature and specific electric resistance.

The cover insulating layer 7 is formed from the same resin film as that of the base insulating layer 5, as shown in FIG. 3. The cover insulating layer 7 is preferably formed from a polyimide film. The cover insulating layer 7 usually has thickness of 2–35 µm, or preferably 5–15 µm.

As shown in FIG. 1, the cover insulating layer 7 has a generally rectangular, flat, strip-shaped form extending longitudinally, to cover the two main wirings 11, 12 in the wiring-forming portion 2. It also has a generally rectangular, flat, widened form to cover the two sensor wiring bases 13, 14 but expose the sensor portion 16 in the sensor-forming portion 3. Further, it also has a generally rectangular, flat, widened form to cover the two connector wiring bases 17, 18 but expose the two connector wirings 19, 20 in the connector-forming portion 4.

Figure 5:
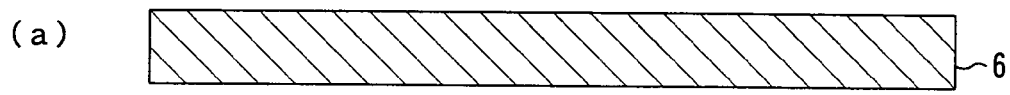
FIG. 5 is sectional view taken along line A–A' illustrating an embodiment of a production process of the flexible wired circuit board for temperature measurement shown in FIG. 1.
Figure 5:
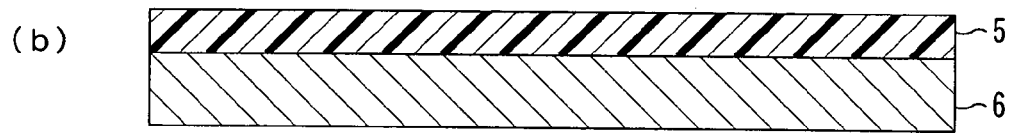
Figure 5:
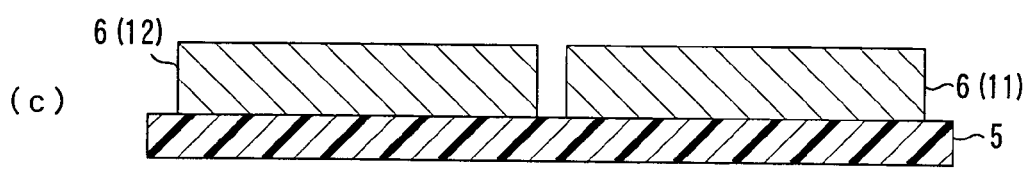
Figure 5:
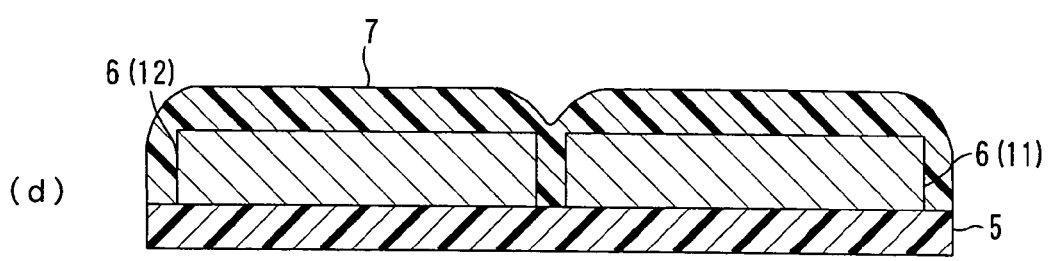

Next, an embodiment of a method for producing this flexible wired circuit board 1 for temperature measurement will be described with reference to FIG. 5.

This flexible wired circuit board 1 for temperature measurement is produced in the following manner. First, the conductor layer 6 formed from the metal foil having the proportional relation between temperature and specific electric resistance as mentioned above is prepared, as shown in FIG. 5(a). Then, the base insulating layer 5 is formed on the conductor layer 6, as shown in FIG. 5(b). The base insulating layer 5 can be formed, for example, by applying a resin solution to a surface of the conductor layer 6 and then, after drying, curing that resin solution by heating.

The resin solution can be prepared by dissolving the resin in organic solvent and the like. For example, liquid solution of polyamic acid resin which is precursor of polyimide is used as the resin solution.

Also, the application of the resin can be made properly by using a known application method such as a doctor blade method and a spin coat method. The applied resin is dried properly by heating and then is cured by heating at a temperature in the range of e.g. 300–450° C. The base insulating layer 5 comprising the resin film is formed on the conductor layer 6 in this manner.

Alternatively, the base insulating layer 5 may be formed by bonding a resin film previously formed in a film-like form to the conductor layer 6 via adhesive.

Further, the base insulating layer 5 may also be presented in the form of a predetermined pattern in which the wiring forming portion 2, the sensor forming portion 3 and the connector forming portion 4 are formed as mentioned above, for example, by applying liquid solution of photosensitive resin, such as photosensitive polyamic acid resin, over the conductor layer 6 and then exposing and developing it.

In the illustrated method, the conductor layer 6 is then formed into the predetermined pattern mentioned above, as shown in FIG. 5(c). FIG. 5(c) is shown in an inversed position from that of FIG. 5(b).

The conductor layer 6 can be formed in the predetermined pattern mentioned above by using a known patterning process such as a subtractive process.

In the subtractive process, for example, an etching resist corresponding to the predetermined pattern mentioned above is formed on the surface of the conductor layer 6, first; then, with the etching resist as a resist, the conductor layer 6 is etched by using a known etching liquid, such as ferric chloride solution; and then the etching resist is removed. As a result of this, part of the conductor layer 6 that was not etched is formed in the predetermined pattern serving as the main wiring portion 8, sensor-wiring portion 9 and connector-wiring portion 10.

Other known patterning process, such as an additive process or a semi-additive process, may also be used to from the conductor layer 6 in the predetermined pattern. In this alternative process, the base insulating layer 5 comprising a resin film is prepared and the conductor layer 6 is formed on the base insulating layer 5 in the form of the predetermined pattern.

For example, when the conductor layer 6 is formed from a stainless foil or a titanium foil, the passive film (oxide film) is preferably formed on the surface of the conductor layer 6, though not shown. The passive film can be formed by a known passivation process, such as an electrochemical passivation process and a chemical passivation process. Preferably, the passive film is formed in the electrochemical passivation process by polarizing an anode or cathode and controlling an electric potential in a passive region or a transpassive region. More specifically, for example the base insulating layer 5 forming the conductor layer 6 thereon is dipped in a nitric acid bath and a voltage is applied in the state in which the conductor layer 6 is oriented to the anode. Forming this passive film can provide a more linearly proportional correlation between temperature and specific electric resistance.

Sequentially, in the illustrated method, the cover insulating layer 7 is formed on the base insulating layer 5 including the conductor layer 6, as shown in FIG. 5(d). The cover insulating layer 7 may be formed by applying a resin solution and then, after drying, curing it by heating, as is the case with the base insulating layer 5.

After the cover insulating layer 7 is formed, openings for exposing the sensor wiring 15 and the connector wirings 19, 20 are formed in a known method, such as drilling, laser machining, punching or etching, though not illustrated. The openings may be formed by using a screen mask with which all parts of the cover insulating layer 7, except the parts corresponding to the openings, are masked to protect the parts corresponding to the openings from the resin solution applied.

The cover insulating layer 7 may be formed by bonding the resin film previously formed in a film-like form to the conductor layer 6 via the adhesive (if necessary, the openings for exposing the sensor wiring 15 and the connector wirings 19, 20 may be previously formed in the resin film), as is the case with the above.

Further, the cover insulating layer 7 may also be presented in the form of the predetermined pattern forming therein the openings for exposing the sensor wiring 15 and the connector wirings 19, 20 by applying liquid solution of photosensitive resin over the conductor layer 6 and then exposing and developing it in the same manner as in the above.

Thereafter, the laminated layers are stamped into a predetermined form having the wiring forming portion 2, the sensor forming portion 3 and the connector forming portion 4, to produce the flexible wired circuit board 1 for temperature measurement, though not shown.

When the connector wirings 19, 20 are connected to a specific electric resistance measuring device having the capability of temperature conversion, the flexible wired circuit board 1 for temperature measurement thus produced, in which the conductor layer 6 is formed from a metal foil having a proportional relation between temperature and specific electric resistance, can prevent errors in measured temperature even when used in a high-temperature atmosphere, thus providing improved temperature measurement accuracy, different from the flexible wired circuit board having the conductor layer comprising a copper foil. Also, in the flexible wired circuit board 1 for temperature measurement, since the sensor portion 16 is integrally formed in such a conductor layer 6, there is no need to provide the cover member, thus achieving reduction of cost.

Therefore, even when the flexible wired circuit board 1 for temperature measurement is disposed in the vicinity of a fuel combustion chamber 22 of an engine 21 in high-temperature atmosphere of e.g. 110–170° C. for the long term, for controlling the automotive engine, as shown in FIG. 6, the temperature can be measured with high accuracy of within an error range of plus or minus 1° C. at reduced cost.

Although in the illustrated embodiment, the sensor portion 16 is formed into the illustrated pattern by folding back the sensor wiring 15 in a continuous S-shaped form, so that adjacent parts of the sensor wiring 15 extending in parallel are spaced apart from each other at a predetermined interval in the widthwise direction, no particular limitation is imposed on the pattern of the temperature detecting portion in the present invention. For example, the sensor portion 16 may be formed into another pattern by folding back the sensor wiring 15 in a continuous S-shaped form, so that adjacent parts of the sensor wiring 15 extending in parallel are spaced apart from each other at a predetermined interval in the lengthwise direction. It may also be formed into still another pattern by winding the sensor wiring 15 spirally. Any adequate pattern can be selected for various purposes (e.g. accuracy prescribed) and applications (e.g. degree of heat resistance).

This flexible wired circuit board 1 for temperature measurement is effectively applicable to a variety of fields requiring temperature measurement accuracy in high-temperature atmosphere, as well as to the control of automotive engine.

EXAMPLES

While in the following, the present invention will be described in further detail with reference to Example, the present invention is not limited thereto.

Example 1

A stainless foil (SUS304) having thickness of 20 μm serving as the conductor layer was prepared, first (See FIG. 5(a)).

Then, polyamic acid resin was applied to the conductor layer and, after dried, it was cured by heating at 400° C. to thereby form the base insulating layer comprising polyimide having thickness of 10 μm (See FIG. 5(b)).

Sequentially, an etching resist corresponding to the predetermined pattern in which the main wiring portion, the sensor wiring portion and the connector wiring portion are formed is formed on a surface of the conductor layer. Then, with the etching resist as a resist, the conductor layer was etched by using ferric chloride solution. Thereafter, the etching resist is removed. As a result of this, the conductor layer was formed in the pattern in which the main wiring portion, sensor-wiring portion and connector-wiring portion are formed (See FIG. 5(c)). In forming the pattern, the sensor wiring in the sensor portion of the sensor-wiring portion was set to be 124 mm in length and 130 μm in pitch (wiring width of 50 μm/space width of 80 μm).

Sequentially, the base insulating layer forming the conductor layer thereon was dipped in a nitric acid bath and a voltage was applied for ten seconds in the state in which the conductor layer was oriented to the anode to form a passive film on the surface of the conductor layer.

Then, photosensitive polyamic resin solution was applied over the base insulating layer including the conductor layer. Then, the resin was exposed to light and developed by using a photo mask, whereby the predetermined pattern in which openings for exposing the sensor wiring and the connector wirings were formed was formed. Thereafter, the resin was cured by heating at 400° C., to form the cover insulating layer comprising polyimide having thickness of 10 μm (See FIG. 5(d)).

Thereafter, the laminated layers are stamped along outline to thereby produce the flexible wired circuit board for temperature measurement.

While the illustrative embodiment of the present invention is provided in the above description, such is for illustrative purpose only and it is not to be construed restrictively. Modification and variation of the present invention that will be obvious to those skilled in the art is to be covered by the following claims.

What is claimed is:

1. A flexible wired circuit board having a plurality of layers formed in a generally rectangular, flat, strip-shape, and having a central portion and end portions, for temperature measurement, said layers comprising:

a conductor layer having two sides; and
a base insulating layer having two sides, wherein one side of the conductor layer is formed on one side of said base insulating layer;
wherein the central portion of the base insulating layer is generally narrow;
wherein the end portions of the base insulating layer are relatively rectangular, flat and laterally widened;
wherein the conductor layer is formed from a metal foil having a proportional relation between temperature and specific electric resistance;
wherein said conductor layer is formed as a predetermined pattern in which a relatively widened main wiring portion, a sensor-wiring portion extending continuously from one lateral end of the main wiring portion, and a connector-wiring portion extending continuously from the other lateral end of the main wiring portion are formed in one piece;
the sensor-wiring portion includes a temperature detecting portion formed of sensor wiring in a relatively thin, S-shaped form; and wherein the temperature detecting portion is formed on the base insulating layer at one of the generally rectangular, flat, widened end portions of the base insulating layer, and the connector-wiring portion is formed at the other of the generally rectangular, flat, widened end portions of the base insulating layer.

2. The flexible wired circuit board for temperature measurement according to claim 1, wherein the conductor layer is a stainless foil.

3. The flexible wired circuit board for temperature measurement according to claim 1, wherein the wiring in the temperature detecting portion has an entire length of 50 mm or more.

4. The flexible wired circuit board for temperature measurement according to claim 1, wherein the adjacent parts of the wiring in the temperature detecting portion are spaced apart from each other at a pitch of 100 μm or more.

5. A flexible wired circuit board having a plurality of layers formed in a generally rectangular, flat, strip-shape, and having a central portion and end portions, for temperature measurement, said layers comprising:

a conductor layer having two sides; and a base insulating layer having two sides, wherein one side of the conductor layer is formed on one side of the base insulating layer;

wherein the central portion of the base insulating layer is generally narrow;

wherein the end portions of the base insulating layer are relatively rectangular, flat and laterally widened;

wherein the conductor layer is formed from a metal foil having a proportional relation between temperature and specific electric resistance;

wherein said conductor layer includes a temperature detecting portion formed when said conductor layer is formed as a wiring portion and arranged in a predetermined pattern on said base insulating layer; and wherein the temperature detecting portion is formed on the base insulating layer at one of the generally rectangular, flat, widened end portions of the base insulating layer.

* * * * *